United States Patent [19]

Feldman et al.

[11] Patent Number: 5,004,321

[45] Date of Patent: Apr. 2, 1991

[54] RESOLUTION CONFOCAL MICROSCOPE, AND DEVICE FABRICATION METHOD USING SAME

[75] Inventors: Martin Feldman, Berkeley Heights; Princess E. Simpson, Plainfield, both of N.J.

[73] Assignee: AT&T Bell Laboratories, Murray Hill, N.J.

[21] Appl. No.: 387,248

[22] Filed: Jul. 28, 1989

[51] Int. Cl.[5] .................. G02B 21/00; G03C 5/00
[52] U.S. Cl. .................... 350/320; 430/325; 350/507
[58] Field of Search ............. 350/402, 400, 507, 320; 430/325

[56] References Cited

U.S. PATENT DOCUMENTS

| 3,148,085 | 9/1964 | Wiegmann | 430/325 |
| 3,258,337 | 6/1966 | Cousins | 430/325 |
| 4,697,866 | 10/1987 | Howard | 350/320 |
| 4,895,423 | 1/1990 | Bilodeau et al. | 350/320 |

*Primary Examiner*—Bruce Y. Arnold
*Assistant Examiner*—James Phan
*Attorney, Agent, or Firm*—B. Tiegerman; G. E. Books

[57] ABSTRACT

A new confocal microscope and a new device fabrication method in which linewidth control is achieved using the new confocal microscope are disclosed. This new confocal microscope has a configuration which achieves multiple passes, e.g., three, four, five, six, seven or more passes, of the incident light through the objective lens of the microscope. As a consequence, the new confocal microscope exhibits a smaller effective depth of focus and a smaller effective resolution than a conventional confocal microscope.

3 Claims, 3 Drawing Sheets

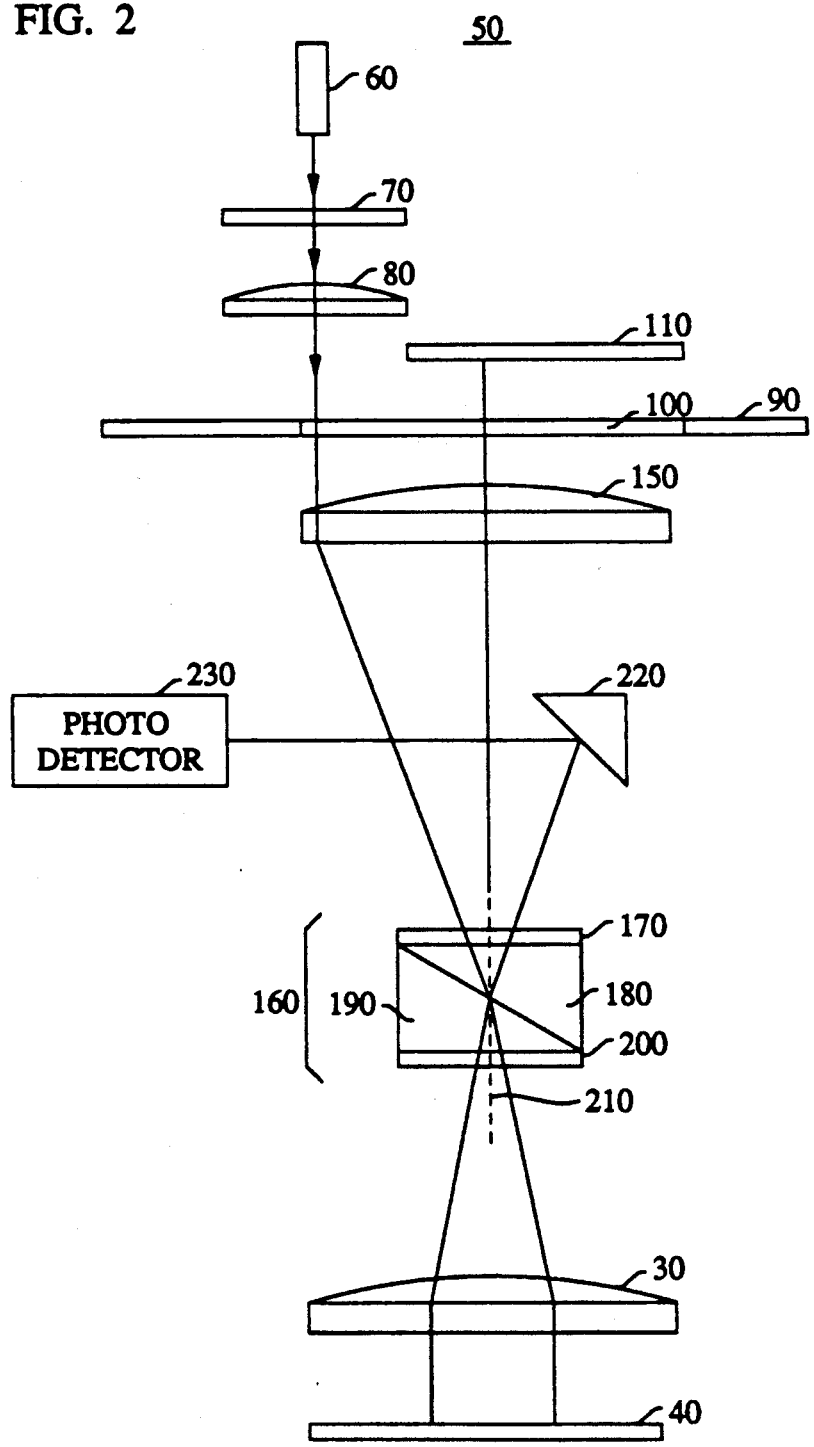

RESOLUTION CONFOCAL MICROSCOPE, AND DEVICE FABRICATION METHOD USING SAME

BACKGROUND OF THE INVENTION

1. Field of the Invention

The invention pertains generally to confocal microscopes and to the application of such microscopes to the fabrication of devices, e.g., semiconductor devices.

2. Art Background

During the fabrication of certain devices, such as semiconductor devices, lithographic processes are used to pattern substrates such as silicon wafers or processed silicon wafers which are, for example, wholly or partially covered by metal, silicon dioxide or polycrystalline silicon. That is, a substrate is coated with an energy-sensitive material called a resist. Selected portions of the resist are exposed to a form of energy which either removes the exposed portions to bare portions of the substrate or more typically induces a change in the solubility or reactivity of the exposed portions in relation to a given developing agent or etchant. The more soluble or reactive portions of the resist are removed, thereby patterning the resist, and the bared portions of the substrate are then treated, e.g., are etched, implanted, or metallized, through the patterned resist.

A significant concern associated with the above-described patterning procedure is the need to achieve good linewidth control during pattern transfer from the patterned resist into the substrate. In this regard, to assure good linewidth control, conventional optical microscopes are currently used to measure the linewidths of features in patterned resists and of device features in patterned substrates. Alternatively, these microscopes are used to measure the linewidths of features in so-called knock-off patterns, i.e., patterns which are representative of the desired device patterns, but formed in one or more portions of the substrate which are discarded and thus not incorporated into the resulting device or devices. If the measured linewidths satisfy a desired criterion, then the device or devices being formed in the substrate are completed. If not, then, for example, the patterned resist (which has failed to satisfy the desired criterion) is removed and a new patterned resist is formed, or the patterned substrate (which has failed to satisfy the desired criterion) is discarded.

As is known, the resolution limit of a conventional optical microscope is the diffraction limit of the microscope objective lens, which is $\lambda/2$ NA, where $\lambda$ is the wavelength of the light and NA denotes the numerical aperture. Because features in semiconductor devices are now as small as, or even smaller than, 1 micrometer ($\mu$m), and thus the sizes of these features are approaching the resolution limit of conventional optical microscopes (operating at visible wavelengths), a need has arisen for linewidth measurement tools having enhanced resolution capabilities.

A microscope which, in effect, exhibits a smaller resolution than that of the conventional optical microscope is the conventional confocal microscope. That is, as depicted in FIG. 1, a conventional confocal microscope 10 typically includes a single objective lens 30 through which the light is passed twice, i.e., light apertured by a pinhole 20 is focused by the objective lens 30 onto a specimen 40, and light reflected from the specimen 40 is focused by the lens 30 onto the pinhole 20, where it is detected. (The aperture 20 is a pinhole, for purposes of the present disclosure, provided the size, e.g., diameter, of the aperture is less than the diffraction limit of the lens 30 at its long conjugate distance, i.e., at the pinhole 20.) As is known, the conventional confocal microscope 10 exhibits a relatively small depth of focus compared to a conventional optical microscope. Consequently, the conventional confocal microscope 10 is capable of achieving a relatively high contrast between the top and bottom of, for example, a step-like feature in the surface of the specimen 40. Because the edge of the step-like feature is thus more accurately determined, the conventional confocal microscope 10 in effect achieves a longitudinal resolution which is smaller than that achievable by a conventional optical microscope. In addition, the conventional confocal microscope achieves a transverse resolution which is smaller than that achievable by a conventional optical microscope by a factor of approximately $1/\sqrt{2}$.

Conventional confocal microscopes have been proposed for use, and presumably are currently being used, in measuring linewidths during semiconductor device manufacture. However, because it is expected that future semiconductor devices will have features which are even smaller than those of present-day devices, microscopes are being sought which exhibit a smaller depth of focus and, in effect, a smaller resolution, than that exhibited by the conventional confocal microscope.

SUMMARY OF THE INVENTION

The invention involves a new confocal microscope which exhibits a smaller effective depth of focus and a smaller effective resolution than the conventional confocal microscope. This new confocal microscope, like the conventional confocal microscope, includes an objective lens. However, by contrast with the conventional confocal microscope, the new confocal microscope has a configuration which achieves multiple passes of the incident light through the objective lens, e.g., three, four, five, six, seven, or more passes. These additional passes of the light through the objective lens produce successive increases in contrast between regions of different reflectivity and/or different focus, e.g., between the top and bottom of a step-like feature, in a specimen or substrate, and thus, in effect, successive decreases in depth of focus. As a consequence, the position of, for example, the edge of a step-like feature is more accurately determined than with a conventional confocal microscope, and thus resolution is effectively enhanced. It should be noted that this enhanced effective resolution is, in general, only achieved for relatively long features and only in relation to the widths of such features, i.e., only the widths of such features are more accurately determined.

BRIEF DESCRIPTION OF THE DRAWINGS

The invention is described with reference to the accompanying drawings, wherein:

FIG. 2 is a cross-sectional view of one embodiment of the inventive confocal microscope;

DETAILED DESCRIPTION

The invention involves a new confocal microscope which exhibits a smaller effective depth of focus and a smaller effective resolution than a conventional confocal microscope. The invention also involves a device fabrication method in which linewidth control is achieved using the new confocal microscope.

With reference to FIG. 2, a first embodiment of the inventive confocal microscope 50 includes an optical source 60, e.g., a laser, such as a helium-neon laser or an argon ion laser. The light produced by the source 60 should include either right- or left-circularly polarized light, which is preferred, or linearly polarized light (which consists of both right- and left-circularly polarized light), which is also useful. If, for example, the optical source 60 is a laser, which typically produces linearly polarized light, then the inventive confocal microscope 50 preferably includes a quarter-wave plate 70 (or its functional equivalent) positioned in the path of the light emitted by the laser, so as to convert the incident linearly polarized light to circularly polarized light. While not essential, the microscope 50 preferably also includes a focusing lens 80, which serves to focus the circularly polarized light emanating from the quarter-wave plate 70 onto an aperture, discussed below.

Figure 1:
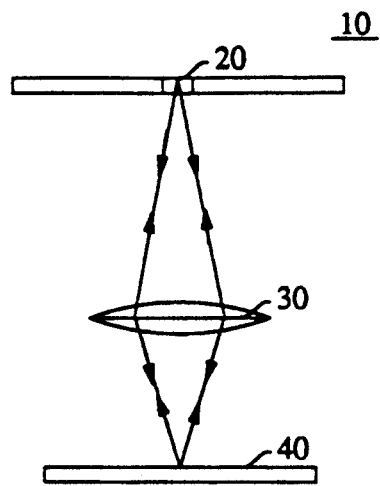
FIG. 1 is a cross-sectional view of a conventional confocal microscope.
Figure 3:
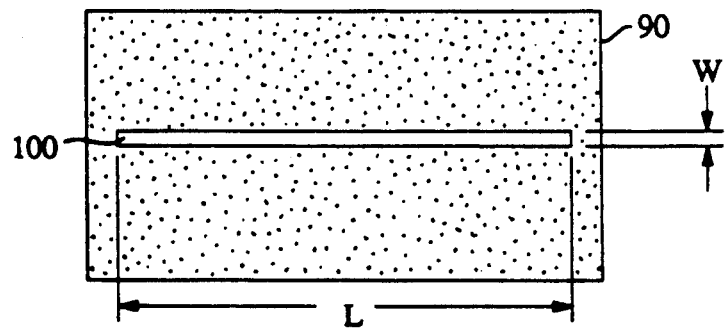
FIG. 3 is a front view of the substantially opaque surface 90, including the slit 100, employed in the embodiment of FIG. 2.

As with a conventional confocal microscope, the inventive confocal microscope 50 includes an apertured surface which serves to define a beam having a cross-sectional dimension which is smaller than the long conjugate diffraction limit of the objective lens 30 of the confocal microscope 50, discussed below. However, in this instance, as depicted in FIGS. 2 and 3, the beam is defined by a substantially opaque surface 90 which includes a slit 100, a portion of which is positioned in the path of the light emanating from the focusing lens 80. (The surface 90 is opaque, for purposes of the present invention, provided it transmits no more than about 10, and preferably no more than about 1, percent of the light incident on the surface.) To achieve the desired beam, the width of the slit, W, should be smaller than the long conjugate diffraction limit of the objective lens. Significantly, as discussed below, the light incident on the slit 100 undergoes multiple passes through the objective lens 30, as well as multiple passes through the slit 100, at different positions along the slit. Consequently, the length of the slit, L, should be sufficiently long to permit these multiple passes.

Rather than using the slit 100, a plurality of spaced pinholes are usefully employed in place of the slit. As with the slit, the sizes of the pinholes should be smaller than the long conjugate diffraction limit of the objective lens.

To achieve the multiple passes of the initially incident light through the slit 100, and by contrast with the conventional confocal microscope, the inventive confocal microscope 50 also includes a substantially planar surface 110, at least partially reflective of the light incident on the slit 100, positioned behind the slit, out of the path of the light emanating from the focusing lens 80. The surface 110 serves to at least partially reflect light which passes through the objective lens and through the slit 100 to impinge the surface 110, back through the slit 100 toward the objective lens. It should be noted that in some instances, rather than using a planar reflective surface 110, it is desirable to use one or more conventional retroreflectors, each of which typically includes two, transversely aligned, at least partially reflective surfaces.

Figure 4:
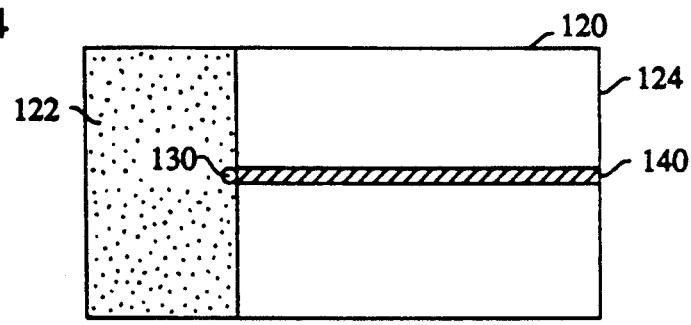
FIGS. 4 and 5 are front views of two alternative embodiments of an apertured, partially mirrored surface 120, which is a useful substitute for the combination of the slit-containing, substantially opaque surface 90 and the at least partially reflective surface 110 employed in the embodiment of FIG. 2.
Figure 5:
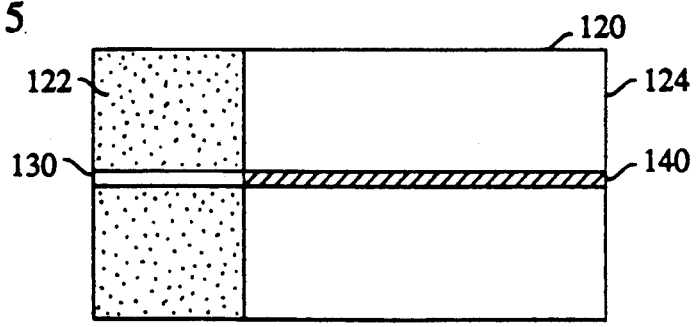

Although the apertured, beam-defining surface 90 and reflective surface 110 constitute two separate components in the embodiment depicted in FIG. 2, the two functions performed by these two components are readily incorporated into a single component. For example, as depicted in FIGS. 4 and 5, the surfaces 90 and 110 are readily replaced by a single surface 120 which includes an aperture 130, in the form of a pinhole (FIG. 4) or of a slit (FIG. 5), and a mirrored strip 140. The aperture 130 is positioned within an opaque portion 122 of the surface 120, while the mirrored strip is positioned within an optically transparent or absorbing portion 124 of the surface 120.

Like a conventional confocal microscope, as depicted in FIG. 2, the inventive confocal microscope 50 includes an objective lens 30, which serves to focus light transmitted by the slit 100 onto a specimen 40, and direct reflected light back toward the slit 100. However, by contrast with the conventional confocal microscope, the inventive microscope 50 also includes a device 160, positioned between the slit 100 and the objective lens 30, which serves to successively increase the angular orientation of incident light, relative to an (imaginary) axis 210 of the device 160, in either the clockwise or counterclockwise direction (as viewed in FIG. 2), during successive passes of the light through the device. In addition, while not essential to the invention, the inventive microscope 50 preferably further includes a field lens 150 positioned between the slit 100 and device 160, which serves to direct light toward the device 160 and objective lens 30. It should be noted that if the field lens 150 is employed, then the device 160 is preferably positioned at the common focus of the field lens 150 and objective lens 30.

In accordance with the invention, the device 160 includes at least one birefringent optical element, e.g., a birefringent lens or a birefringent prism having the shape of, for example, an isosceles triangle, positioned between quarter-wave plates 170 and 200. (A birefringent optical element is one which exhibits either of two refractive indices to incident, linearly polarized light, depending upon the polarization direction of the light. Such an element is characterized by an axis, called the optic axis, along which incident light experiences the same refractive index, regardless of polarization direction.) Preferably, the device 160 includes two birefringent prisms 180 and 190 positioned between the quarter-wave plates 170 and 200, with the optic axis of, for example, the prism 180 being oriented perpendicularly to the plane of the paper and the optic axis of the prism 190 being perpendicular to that of the prism 180 and oriented perpendicularly to the (imaginary) axis 210. More preferably, the prisms 180 and 190 are joined to another, as depicted in FIG. 2, to form what is conventionally called a Wollaston prism.

Figure 6:
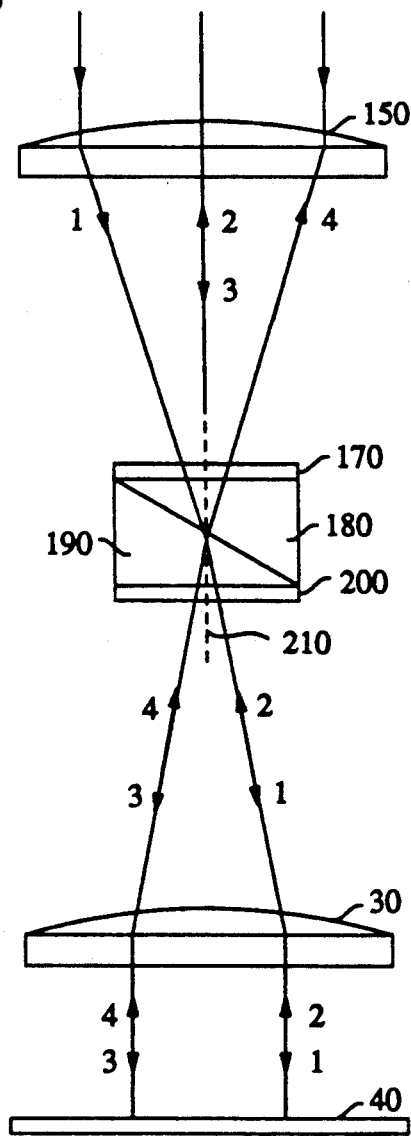
FIG. 6 depicts the functioning of the device 160, included in the embodiment of FIG. 2.

The operation of the device 160 is depicted in, and readily understood with reference to, FIG. 6. That is, assuming the incident-light is (right- or left-) circularly polarized and initially traverses the optical path labeled "1", then after traversing the quarter-wave plate 170 the light will be linearly polarized, with the polarization direction being perpendicular to the propagation direction and aligned parallel to the optic axis of prism 180 or prism 190 (depending upon whether the incident light is right- or left-circularly polarized.) Within the prism 180, the light will experience one of the two refractive indices associated with the prism 180, and will then experience the other refractive index within the prism 190. On propagating through the two prisms, the light will experience a net refraction (governed by Snell's law) determined by the magnitudes of the two refractive indices experienced en route. For example, as depicted in FIG. 6, the net refraction may be such that the propagation direction is incrementally deflected, i.e., rotated, in the clockwise direction, as viewed in FIG. 6. It should be noted that on traversing quarter-wave plate 200, the light will again become circularly polarized.

Significantly, upon reflection from the specimen 40, the light will remain circularly polarized, but the polarization will be of opposite sense, i.e., right-circularly polarized light will become left-circularly polarized light, and vice versa. In addition, the objective lens 30 will focus the reflected light onto the device 160, and thus cause the light to retrace its original path, i.e., cause it to follow the path labeled "2". However, upon traversing the quarter-wave plate 200, the light will again become linearly polarized, but this time the polarization direction will be reversed (by virtue of the change in the sense of the circular polarization). As a consequence, upon traversing the prisms 190 and 180, the light will, in each prism, experience the refractive index which was previously unexperienced in that prism, and will suffer a net refraction which, again, incrementally rotates the propagation direction in the clockwise direction. Upon reflection from the surface 110, the field lens will focus the light onto the device 160 and, as a consequence, the light will follow the path labeled "3". Similarly, upon subsequent reflection from the specimen 40, the light will follow the path labeled "4", and so on. Thus, with each successive pass of the light through the device 160, the angular orientation of the propagation direction of the light, relative to the (imaginary) axis 210, is successively increased, in this instance, in the clockwise direction. Of course, if the sense of the circular polarization of the initially incident light had been reversed, then the angular orientation of the propagation direction would have been successively increased in the counterclockwise direction.

It should be noted that if the initially incident light is linearly polarized, rather than circularly polarized, then, because linearly polarized light consists of the superposition of right- and left-circularly polarized components, the propagation directions of the two components will diverge. That is, the angular orientation of the propagation direction of the right-circularly polarized component will undergo successive increases in, for example, the clockwise direction, during successive passes through the device 160. On the other hand, the angular orientation of the propagation direction of the left-circularly polarized component will undergo successive increases in the opposite direction, e.g., the counterclockwise direction, during successive passes through the device 160. If, however, the geometric arrangement of the slit 100 and reflective surface 110 is such that only one of the components is intercepted by the slit 100 and surface 110 during successive passes through the device 160, as is usual, then only the one component will be processed, as described above.

With reference once again to FIG. 2, in addition to the microscope components described above, the inventive confocal microscope 50 also includes a pickoff mirror 220, located adjacent the field lens 150. This mirror is positioned to intercept the light after the light has passed through the device 160 a chosen, even number of times, e.g., two, four, six or eight times, and to reflect the light toward a photodetector 230. (If the incident light were to originate from below, rather than above, the specimen 40, and if the specimen was at least partially transparent to the incident light, then the pickoff mirror 220 would be positioned to intercept the light after the light had passed through the device 160 a chosen odd number of times, e.g., three, five, seven or nine times.)

It should be noted that with each pass of the incident light through the optical elements of the microscope 50, there is an accompanying optical loss and a corresponding reduction in the intensity of the light. Consequently, the number of passes is limited by the sensitivity of the photodetector 230.

In the overall operation of the inventive confocal microscope 50, the light produced by the optical source 60, after traversing the quarter-wave plate 70, is focused by the lens 80 onto one end of the slit 100, to produce a beam having a dimension smaller than the long conjugate diffraction limit of the objective lens 30. This light beam is then focused by the field lens 150 onto the device 160, where the propagation direction of the beam is altered. The resulting beam is then focused by the objective lens 30 onto the specimen 40, where a region of the specimen 40, equal in size to the focused spot-size of the beam, is impinged. Upon reflection from the specimen 40, the objective lens 30 focuses the beam onto the device 160, where the propagation direction of the beam is again altered, and the resulting beam is then focused by the field lens 150 onto the slit 100. Upon reflection from the reflective surface 110, the beam retraces its path, until its propagation direction is again altered by the device 160, resulting in the beam impinging a different region of the specimen 40. After reflection from this different region, and after having its propagation direction altered yet again by the device 160, the beam impinges the slit 100 at a position which is laterally displaced from the position previously impinged. Thus, by virtue of the above-described process, the beam traverses the specimen 40, in one direction, and also traverses the slit. Significantly, if the beam traverses an edge of a relatively long, step-like feature in the specimen 40, then the successive reflections of the beam result in successive increases in the contrast between the top and bottom of the feature. If the beam is used to traverse the length of the feature at different width positions, the positions of both edges are readily accurately determined, and thus the width is accurately determined.

In order to readily detect the beam after each reflection from the specimen 40, and thereby take advantage of the increased contrast produced after each such reflection, the net angular deflection, $\delta$, suffered by the beam during a round trip from, and then back to, the slit 100, should result in a lateral displacement of the beam, S, at the slit 100 which is greater than or equal to the spot size of the beam. In this regard, as discussed above, the slit 100 produces a beam having a cross-sectional dimension which is less than the long conjugate diffraction limit of the objective lens 30, $\lambda/2$ NA. If R denotes the distance between the device 160 and the field lens 150, and if $\delta$ is small, then S is approximately given by $S = \delta R.$ To meet the above condition, it follows that $S = \delta R > \lambda/2NA.$ and therefore $\delta > \dfrac{\lambda}{2(NA)R}.$ Significantly, the above relation between $\delta$, $\lambda$, NA and R defines, in effect, the relation between the refractive indices of the one or more birefringent elements of the device 160 and the other parameters characterizing the inventive confocal microscope 50, which is all the information needed to build the inventive microscope.

As noted above, in addition to the new confocal microscope 50, the invention also involves a new device fabrication method in which linewidth control is achieved using the new confocal microscope. In this regard, when fabricating, for example, a semiconductor device, a substrate, such as a processed or unprocessed silicon wafer, is coated with a resist, which is patterned. The linewidths of relatively long features in the patterned resist are then readily determined, using the new confocal microscope 50. That is, when measuring the width of a relatively long feature in the patterned resist, the microscope 50 is positioned so that the slit 100 is aligned parallel to the feature in the patterned resist. The light beam from the microscope 50 then traverses the length, or at least a portion of the length, of the feature, at different width positions. Each such traverse requires the light beam to make at least four passes through the objective lens 30, so that the beam will impinge at least two different regions of the feature, and be detected via the pickoff mirror 220 and photodetector 230. (If the incident light originates from below the substrate, and if the substrate and resist are at least partially transparent to the incident light, then just three passes of the light beam through the objective lens 30 will result in two different regions of the feature being impinged.) If the measured linewidths of the features in the patterned resist conform to a desired criterion, then the pattern in the patterned resist is transferred into the substrate, and the device or devices being formed in the substrate are completed, using conventional techniques. If the measured linewidths do not conform to the desired criterion, then the patterned resist is removed, a new patterned resist is formed, and the above procedure is repeated.

In an alternative embodiment of the inventive device fabrication method, the inventive confocal microscope is used to measure the linewidths of actual device features, or of the features in knock-off patterns, in a patterned substrate. If the measured linewidths satisfy a desired criterion, then the device or devices being formed in the substrate are completed. If not, then the substrate is discarded.

We claim:

1. A method for fabricating a device, comprising the steps of:

forming a patterned resist on a substrate;

optically imaging at least a portion of at least one feature in said patterned resist via a lens;

transferring the pattern in said patterned resist into said substrate and completing the fabrication of said device in said substrate wherein said imaging step includes the substeps of passing the same light beam through said lens three or more times to impinge two or more different regions of said feature with said light beam.

2. A method for fabricating a device, comprising the steps of:

at least partially fabricating said device;

optically imaging at least a portion of at least one feature of said at least partially fabricated device via a lens; and completing said at least partially fabricated device, wherein said imaging step includes the substeps of passing the same light beam through said lens three or more times to impinge two or more different regions of said feature with said light beam.

3. A method for fabricating a device, comprising the steps of:

forming a pattern in a substrate, the resulting patterned substrate including a first portion to be incorporated into said device and a second portion to be discarded;

optically imaging at least a portion of at least one feature of the pattern formed in said second portion via a lens; and completing said device, wherein said imaging step includes the substeps of passing the same light beam through said lens three or more times to impinge two or more different regions of said feature with said light beam.

* * * * *